United States Patent
Annunziata et al.

(10) Patent No.: US 10,566,524 B2
(45) Date of Patent: *Feb. 18, 2020

(54) SUB-LITHOGRAPHIC MAGNETIC TUNNEL JUNCTIONS FOR MAGNETIC RANDOM ACCESS MEMORY DEVICES

(71) Applicant: INTERNATIONAL BUSINESS MACHINES CORPORATION, Armonk, NY (US)

(72) Inventors: Anthony J. Annunziata, Stamford, CT (US); Babar A. Khan, New York, NY (US); Chandrasekara Kothandaraman, New York, NY (US); John R. Sporre, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/814,797

(22) Filed: Nov. 16, 2017

(65) Prior Publication Data

US 2018/0287054 A1    Oct. 4, 2018

Related U.S. Application Data

(63) Continuation of application No. 15/471,497, filed on Mar. 28, 2017, now Pat. No. 9,911,914.

(51) Int. Cl.
*H01L 27/22* (2006.01)
*H01L 43/12* (2006.01)
(Continued)

(52) U.S. Cl.
CPC ............ *H01L 43/12* (2013.01); *G11C 11/161* (2013.01); *H01L 27/222* (2013.01); *H01L 43/08* (2013.01)

(58) Field of Classification Search
CPC ....................................................... H01L 43/12
See application file for complete search history.

(56) References Cited

U.S. PATENT DOCUMENTS

| 5,714,039 A | 2/1998 | Beilstein, Jr. et al. |
| 6,291,137 B1 | 9/2001 | Lyons et al. |
| | (Continued) | |

OTHER PUBLICATIONS

Anthony J. Annunziata, et al., Pending U.S. Appl. No. 15/471,497, entitled "Sub-Lithographic Magnetic Tunnel Junctions for Magnetic Random Access Memory Devices," filed Mar. 28, 2017.

(Continued)

*Primary Examiner* — Mohammad M Choudhry
(74) *Attorney, Agent, or Firm* — Cantor Colburn LLP; Vazken Alexanian

(57) ABSTRACT

Methods of forming the MRAM generally include forming an array of MTJ having sub-lithographic dimensions. The array can be formed by providing a substrate including a MTJ material stack including a reference ferromagnetic layer, a tunnel barrier layer, and a free ferromagnetic layer on an opposite side of the tunnel barrier layer. A hardmask layer is deposited onto the MTJ material stack. A first sidewall spacer is formed on the hardmask layer in a first direction. A second sidewall spacer is formed over the first sidewall in a second direction, wherein the first direction is orthogonal to the second direction. The second sidewall spacer intersects the first sidewall spacer. The first sidewall spacer is processed using the second sidewall spacer as mask to form a pattern of oxide pillars having sub-lithographic dimensions. The pattern of oxide pillars are transferred into the MTJ stack to form the array.

9 Claims, 5 Drawing Sheets

(51) Int. Cl.
*G11C 11/16* (2006.01)
*H01L 43/08* (2006.01)

(56) References Cited

U.S. PATENT DOCUMENTS

| | | | |
|---|---|---|---|
| 6,682,943 B2 | 1/2004 | Durcan et al. | |
| 8,557,704 B2 | 10/2013 | Wells et al. | |
| 8,962,493 B2 | 2/2015 | Levi et al. | |
| 9,118,002 B2 | 8/2015 | Seo et al. | |
| 9,269,590 B2 | 2/2016 | Luere et al. | |
| 2004/0229430 A1* | 11/2004 | Findeis | H01L 43/12 438/257 |
| 2007/0152205 A1* | 7/2007 | Chen | H01L 27/2463 257/4 |
| 2016/0020251 A1* | 1/2016 | Kim | H01L 27/228 257/295 |
| 2016/0079307 A1* | 3/2016 | Lu | H01L 27/222 257/421 |

OTHER PUBLICATIONS

List of IBM Patents or Patent Applications Treated as Related; (Appendix P), Date Filed Nov. 16, 2017; 2 pages.
C. H. Lam, "The Universal Semiconductor Memory." 11th International Conference on Solid-State and Integrated Circuit Technology (ICSICT), 2012, 5 pages.
T. Min et al., "Status and outlook of STT-MRAM development," Proc. of SPIE, vol. 9167, 2014, 91671B, 8 pages.

* cited by examiner

SUB-LITHOGRAPHIC MAGNETIC TUNNEL JUNCTIONS FOR MAGNETIC RANDOM ACCESS MEMORY DEVICES

DOMESTIC PRIORITY

This Application is a CONTINUATION of U.S. patent application Ser. No. 15/471,497, filed on Mar. 28, 2017, incorporated herein by reference in its entirety.

BACKGROUND

The present invention generally relates to fabrication methods and resulting structures for semiconductor devices. More specifically, the present invention relates to sub-lithographic magnetic tunnel junctions for magnetic random access memory (MRAM) devices.

MRAM devices such as spin-transfer torque MRAM (STT MRAM) are well suited for many mainstream applications, particularly as a storage technology, because it delivers the high performance of DRAM and SRAM, has the low power and low cost of flash memory, and leverages existing CMOS manufacturing techniques and processes. The magnetic tunnel junctions (MTJs) in these MRAM devices can be switched between a low resistance state (0) and a high resistance state (1) by applying a voltage and sending a current through the device. Because it is non-volatile, STT-MRAM will also retain its data indefinitely when the power is lost or completely turned off. Moreover, it is desirable that the device be able to switch at low currents to minimize power consumption as well as to enable the device to be integrated with the most advanced CMOS circuitry for which supply voltages are low. One way to lower the switching current and improve the efficiency of an STT MRAM device is to reduce its size. With the best available lithographic printing available, as well as the best processes, the present size of the MTJ is generally limited to about 35 nm in order to fabricate large memory arrays reproducibly and reliably.

SUMMARY

Embodiments of the present invention are directed to methods of fabricating a semiconductor device. In one or more embodiments, a method of fabricating a semiconductor device includes providing a substrate including multiple layers thereon for defining a magnetic tunnel junction material stack. The multiple layers include a reference ferromagnetic layer having a fixed magnetic polarity, a tunnel barrier layer, and a free ferromagnetic layer on an opposite side of the tunnel barrier layer. A hardmask layer is deposited onto the magnetic tunnel junction material stack and a first spacer line pattern is formed on the hardmask layer in a first direction, wherein the first spacer line pattern is formed of an oxide. A second spacer line pattern is formed in a second direction over the first spacer line pattern to provide an intersection between the first and second spacer line patterns, wherein the first direction is orthogonal to the second direction. The substrate is etched to remove non-intersecting portions of the first spacer line pattern from the substrate and exposed portions of the second spacer line pattern to isolate the intersecting portion of the first spacer line pattern, wherein the intersecting portion of the first spacer line pattern defines a sub-lithographic feature. The hardmask layer is etched to the magnetic junction material stack to transfer the intersecting portion into the hardmask layer. The magnetic junction material stack is etched to form an array of magnetic tunnel junction having dimensions corresponding to the sub-lithographic feature.

In one or more embodiments, a method of fabricating a semiconductor device includes providing a substrate including multiple layers thereon for defining a magnetic tunnel junction material stack, the multiple layers including a reference ferromagnetic layer having a fixed magnetic polarity, a tunnel barrier layer, and a free ferromagnetic layer on an opposite side of the tunnel barrier layer. A hardmask layer is deposited onto the magnetic tunnel junction material stack. A first sidewall spacer is formed on the hardmask layer in a first direction. A second sidewall spacer is formed over the first sidewall in a second direction, wherein the first direction is orthogonal to the second direction, and wherein the second sidewall spacer intersects the first sidewall spacer. The first sidewall spacer is processed using the second sidewall spacer as mask to form a pattern of oxide pillars on the hardmask layer corresponding to the intersection between the first and second sidewall spacers, wherein the oxide pillars have sub-lithographic dimensions. The oxide pillars are transferred into the hardmask layer by etching to provide a patterned hardmask layer with the sub-lithographic dimensions. The patterned hardmask layer is transferred by etching the magnetic junction material stack to form an array of magnetic tunnel junction having the sub-lithographic dimensions.

In one or more embodiments, a method of fabricating a semiconductor device includes providing a substrate including multiple layers thereon for defining a magnetic tunnel junction material stack, the multiple layers including a reference ferromagnetic layer having a fixed magnetic polarity, a tunnel barrier layer, and a free ferromagnetic layer on an opposite side of the tunnel barrier layer. A tantalum nitride hardmask layer is deposited onto the magnetic tunnel junction material stack. A first sidewall spacer is formed on the hardmask layer in a first direction, wherein forming the first sidewall spacer includes lithographically patterning a first mandrel layer to form a first mandrel pattern having substantially vertical sidewalls. The first sidewall spacer formed on the substantially vertical sidewalls, wherein the first sidewall spacers have a sub-lithographic width. The first mandrel pattern is removed to isolate the first sidewall spacers. The first sidewall spacers are transferred into an oxide layer to form a patterned oxide layer. An amorphous silicon layer is deposited onto the patterned oxide layer. A second sidewall space is formed on the amorphous silicon layer in a second direction orthogonal to the first direction to provide a lattice arrangement to the first and second sidewall spacers, wherein forming the second sidewall spacer includes lithographically patterning a second mandrel layer to form a second mandrel pattern having substantially vertical sidewalls. The second sidewall spacers are formed on the substantially vertical sidewalls. The second mandrel pattern is removed to isolate the second sidewall spacers. The first sidewall spacers are processed using the second sidewall spacer as mask to form a pattern of oxide pillars on the hardmask layer corresponding to the intersection between the first and second sidewall spacers, wherein the oxide pillars have sub-lithographic dimensions. The pattern of oxide pillars is etched into the hardmask layer to provide a patterned hardmask layer with the sub-lithographic dimensions. The patterned hardmask layer is transferred by etching the magnetic junction material stack to form an array of magnetic tunnel junction having the sub-lithographic dimensions.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
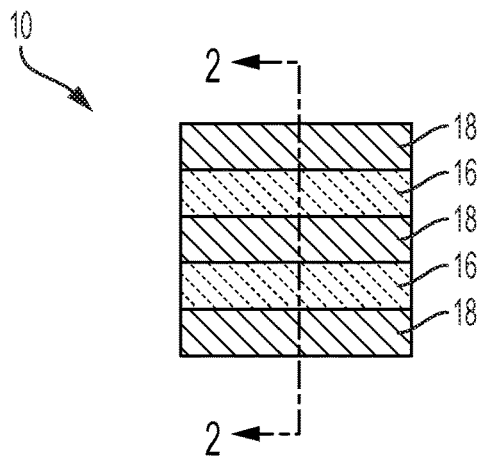
FIG. 1 is a top down view depicting a semiconductor device after a fabrication operation according to embodiments of the invention.

The diagrams depicted herein are illustrative. There can be many variations to the diagram or the operations described therein without departing from the spirit of the invention. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

The present invention is generally directed to structures and processes that use first and second spacers formed along orthogonal axes to form a sub-lithographic region at the intersection of the first and second spacers, which is then etched into a hard mask. The patterned hardmask is further etched to define the MTJ at the intersection defined by the spacers, which can be used to form a sub-lithographic MTJ array (MTJs less than about 35 nm). The dimensional control is much better with the intersecting spacers as the spacer dimensions are not controlled by lithographic printing but mainly by the spacer material deposition and the subsequent etch processing.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Figure 2:
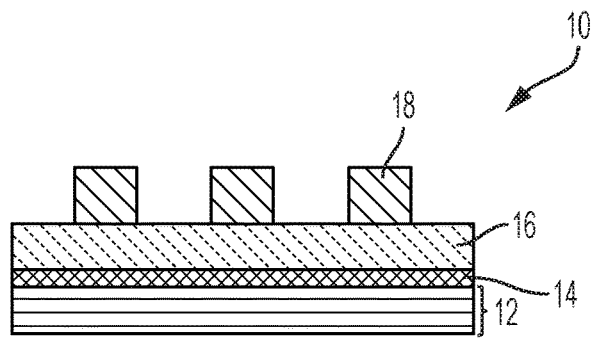
FIG. 2 is a sectional view taken along lines 2-2 of FIG. 1 depicting a semiconductor device after a fabrication operation according to embodiments of the invention.

Turning now to a more detailed description of aspects of the present invention, FIG. 1 depicts a top down view and FIG. 2 depicts a sectional view taken along lines 2-2 of FIG. 1 of an initial structure 10 for forming an array of MTJ stacks according to embodiments of the invention. The initial structure includes multiple layers 12 that correlate to the layers utilized to form an array of MTJs.

The multiple layers 12 defining the MTJ material stack are not intended to be limited and generally include two magnetic layers such as $Co_xFe_yB_z$ separated by a thin dielectric barrier such as magnesium oxide or aluminum oxide and a mechanism to pin the polarization of one of the magnetic layers in a fixed direction. The MTJ material stack is deposited on a bottom electrode.

The polarization direction of the free magnetic layer is used for information storage. The resistance of the memory bit is either low or high, depending on the relative polarization (parallel or antiparallel) of the free layer with respect to the pinned layer. An applied field can switch the free layer between the two states. In an MRAM array, orthogonal lines pass under and over the bit, carrying current that produces the switching field. The bit is designed so that it will not switch when current is applied to just one line, but will always switch when current is flowing through both lines that cross at the selected bit.

The tunneling MR, e.g., dielectric layer between magnetic layers, can be understood in terms of a two-band model in which the d-band is split into spin-up and spin-down bands with different density of states at the Fermi energy. When the magnetization of the layers is parallel, the majority-band electrons tunnel across to the majority band of the opposing electrode and the minority to the minority band. When they are antiparallel, the majority/minority band electrons are forced to tunnel into the minority/majority band of the opposing electrode. The reduced number of states available for tunneling between the ferromagnetic layers when the layers are antiparallel results in an increased tunneling resistance, as compared to parallel.

The various layers of the MTJ stack can be formed by sputter-deposition techniques with deposition rates in the Angstrom-per-second range as is known in the art. Exemplary sputter-deposition techniques include physical vapor deposition, specifically planar magnetron sputtering, and ion-beam deposition. As will be described herein, the multiple layers are etched to define one or more sub-lithographic MTJ devices, which can be in the form of an array of MTJs electrically coupled to an underlying bottom electrode.

A hardmask 14 overlies the multiple layers defining the MTJ stack. The hard mask functions as an etch stop. The material of the hardmask advantageously includes at least TaN. For protection of MTJ layers positioned there below, the hardmask can also consist of a multi-layer composition, for instance, of a dielectric two-layer composition, in particular of $SiO_2$ on TaN. The top layer can be used as a sacrifice layer during the "pull back" step for size reduction while the bottom layer protects the material stack as a protective layer during etching. Both layers can, however, also be considered as individual layers with different functionalities. The hard mask 14 can have a thickness in the range of 1000 to 5000 Å.

In one or more embodiment, the hard mask includes 25 nm of a low temperature oxide (LTO) on top of 100 nm of tantalum nitride (TaN). In the MTJ formation process, the oxide hard mask is etched and then used to etch the TaN portion of the hard mask. The process of forming the LTO generally includes reaction of silane gas with oxygen to form a silicon dioxide layer as is known in the art. During the etching of the TaN, the LTO layer eventually etches completely and a partial thickness of the TaN is left on top after all the layers are completely etched. In the present invention, a sub-lithographic pattern is formed in the upper oxide layer, which is then transferred into the TaN layer to pattern the MTJ material stack 12.

A thin nitride layer of about 5 to about 35 nm is deposited on top of the hard mask. This can also be a thin oxide layer followed by the nitride layer. Then, an oxide layer 16 is deposited on top. The nitride will act as an etch stop when the oxide layer 16 is etched later. The oxide layer can be silicon dioxide, for example. In one or more embodiments, the thickness of the oxide layer can be from 10 nanometers (nm) to 200 nm, and in other embodiments, the thickness of the oxide layer can be from 25 nm to 100 nm, and in still other embodiments, the thickness of the oxide layer can be about 50 nm.

A mandrel layer 18 is deposited onto the oxide layer 16 and patterned using standard lithography and etching techniques. The mandrel layer 18 can be formed of amorphous silicon and can include a line spacing pattern as is generally shown in FIG. 1. The line pitch can vary depending on the desired spacing of the MTJ array.

The lithography process for forming the mandrel pattern can include, for example, introducing electromagnetic radiation such as ultraviolet light through an overlay mask to cure a photoresist material (not shown). Depending upon whether the resist is positive or negative, uncured portions of the resist are removed to form a first resist pattern including openings to expose portions of the top mandrel layer.

The material defining photoresist layer can be any appropriate type of photo-resist materials, which can partly depend upon the device patterns to be formed and the exposure method used. For example, material of photo-resist layer can include a single exposure resist suitable for, for example, argon fluoride (ArF); a double exposure resist suitable for, for example, thermal cure system; and/or an extreme ultraviolet (EUV) resist suitable for, for example, an optical process. Photoresist layer can be formed to have a thickness ranging from about 30 nm to about 150 nm in various embodiments. The resist pattern can be formed by applying any appropriate photo-exposure method in consideration of the type of photo-resist material being used.

The photoresist pattern is then anisotropically etched such as by reactive ion etching (RIE) to define the mandrel pattern and have nearly vertical etch slopes or nearly vertical contact angles. By use of the terms "nearly vertical etch slope" or "nearly vertical contact angle" is meant an angle defined by the sidewall of the opening being formed of at least 80°, preferably about 90°, with the plane of top mandrel being anisotropically etched.

The etching apparatus used in carrying out the anisotropic etch can include any commercially available reactive ion etching (RIE) apparatus, or magnetically enhanced reactive ion etching (MERIE) apparatus, capable of supporting a wafer of the size desired to be etched in which gases of the type used herein can be introduced at the flow rates to be discussed and a plasma maintained at the power levels required for the process. Such apparatus will be generally referred to herein as RIE apparatus, whether magnetically enhanced or not. Examples of such commercially available apparatus include the Precision 5000 magnetically enhanced reactive ion etcher available from Applied Materials, Inc.; the Rainbow reactive ion etcher by Lam; the reactive ion apparatus by Tegal Company; the Quad reactive ion etcher by Drytek, and reactive ion exchange tools available from Tokyo Electron Limited.

Figure 3:
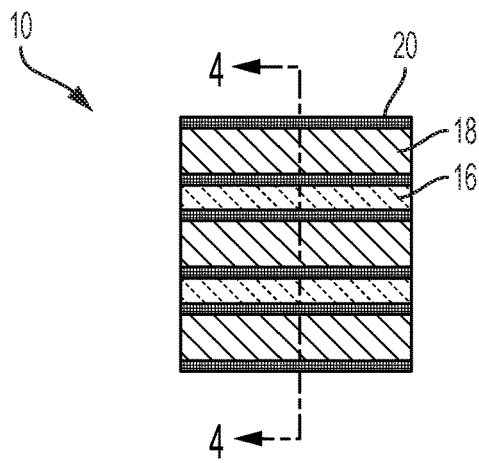
FIG. 3 is a top down view depicting a semiconductor device after a fabrication operation according to embodiments of the invention.
Figure 4:
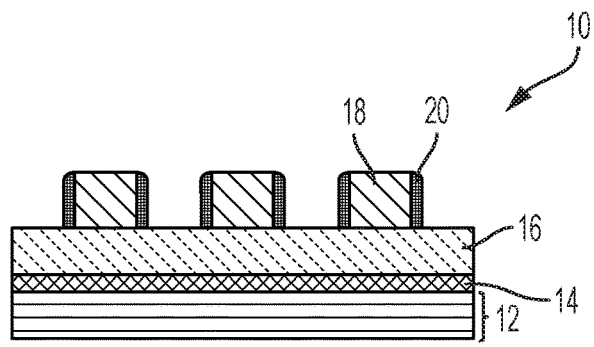
FIG. 4 is a sectional view taken along lines 4-4 of FIG. 3 depicting a semiconductor device after a fabrication operation according to embodiments of the invention.

FIG. 3 depicts a top down view and FIG. 4 depicts a sectional view taken along lines 4-4 of FIG. 3 of the resultant structure 10 subsequent to deposition of a first spacer 20 formed on the sidewalls of the patterned mandrel 18. The first spacer 20 can be formed of silicon nitride, for example, and is generally selected to be etch selective relative to the patterned mandrel. The thickness (i.e., width) is generally selected to be about 2 to 3 nm larger than the targeted dimension to account for etch bias.

The thickness of the mandrel layer 18 (i.e., height of the second spacer 20) is at least ⅔ times that of the oxide layer 16 to take into consideration of the etch selectivities of the different materials. By way of example, the thickness of the mandrel layer 18 is about 50 nm and the underlying oxide layer is 50 nm. In this manner, the first spacers 20 formed on the sidewalls of the mandrel 18 will be at a height of at least ⅔ times that of the first spacer layer 16. Selectivity of etching the silicon oxide in the oxide layer relative to the material used for the first spacer is relatively low compared to some etch selectivities. As such, the mandrel thickness (height) can be used to set the mask height and take into account etch selectivity so as to provide a robust process.

Figure 5:
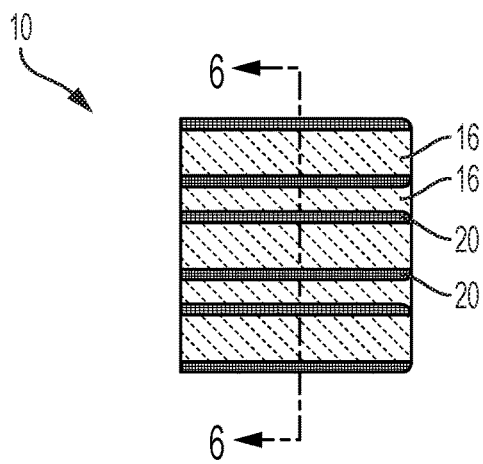
FIG. 5 is a top down view depicting a semiconductor device after a fabrication operation according to embodiments of the invention.
Figure 6:
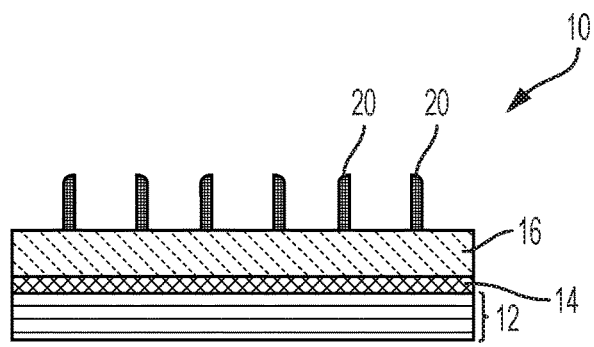
FIG. 6 is a sectional view taken along lines 6-6 of FIG. 5 depicting a semiconductor device after a fabrication operation according to embodiments of the invention.

FIG. 5 depicts a top down view and FIG. 6 depicts a sectional view taken along lines 6-6 of FIG. 5 of the resultant structure subsequent to removal of the mandrel 18 so as to provide a plurality of isolated spacers 20. The mandrel 18 can be stripped by any suitable dry and/or wet etch process, leaving the sidewall spacers 20 isolated on the surface of the oxide surface 16.

Figure 7:
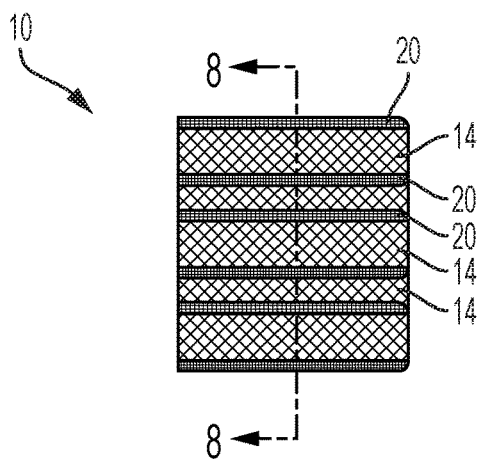
FIG. 7 is a top down view depicting a semiconductor device after a fabrication operation according to embodiments of the invention.
Figure 8:
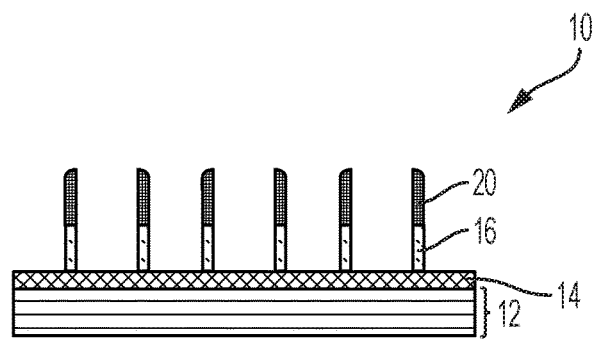
FIG. 8 is a sectional view taken along lines 8-8 of FIG. 7 depicting a semiconductor device after a fabrication operation according to embodiments of the invention.

FIG. 7 depicts a top down view and FIG. 8 depicts a sectional view taken along lines 8-8 of FIG. 7 of the resultant structure subsequent to removal of the exposed surface of the oxide layer to the hard mask layer 14.

Figure 9:
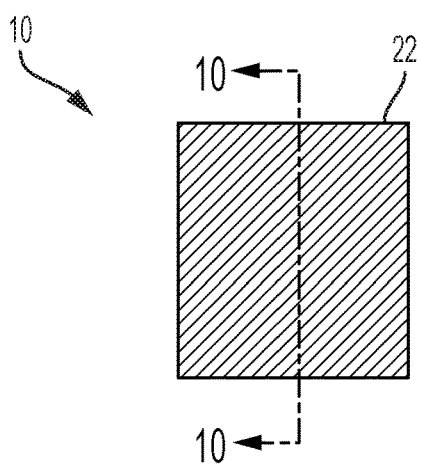
FIG. 9 is a top down view depicting a semiconductor device after a fabrication operation according to embodiments of the invention.
Figure 10:
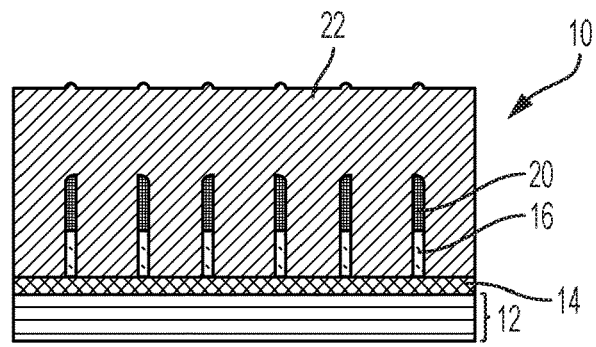
FIG. 10 is a sectional view taken along lines 10-10 of FIG. 9 depicting a semiconductor device after a fabrication operation according to embodiments of the invention.

FIG. 9 depicts a top down view and FIG. 10 depicts a sectional view taken along lines 10-10 of FIG. 9 of the resultant structure subsequent to deposition of a relatively thick layer of an amorphous silicon layer 22.

Figure 11:
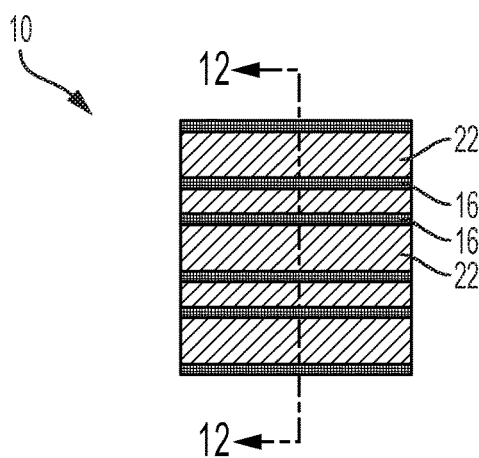
FIG. 11 is a top down view depicting a semiconductor device after a fabrication operation according to embodiments of the invention.
Figure 12:
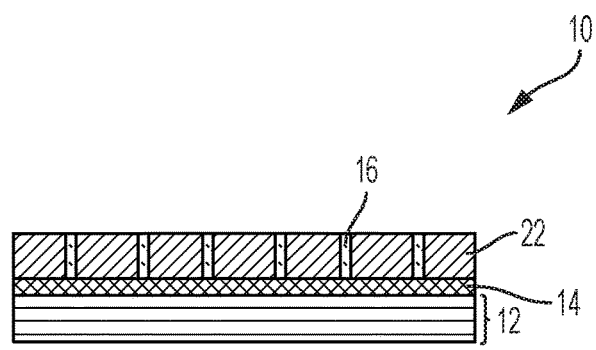
FIG. 12 is a sectional view taken along lines 12-12 of FIG. 11 depicting a semiconductor device after a fabrication operation according to embodiments of the invention.

FIG. 11 depicts a top down view and FIG. 12 depicts a sectional view taken along lines 12-12 of FIG. 11 of the resultant structure subsequent to a planarization process to remove a portion of the amorphous silicon layer 22 stopping at the patterned oxide layer 16 so as to completely remove the spacer layer 20, thereby forming a first spacer pattern of lines in a first direction.

Figure 13:
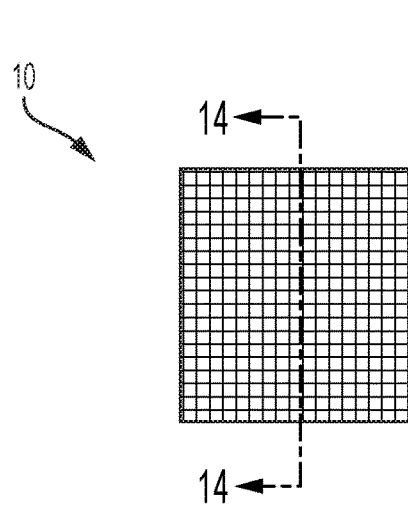
FIG. 13 is a top down view depicting a semiconductor device after a fabrication operation according to embodiments of the invention.
Figure 14:
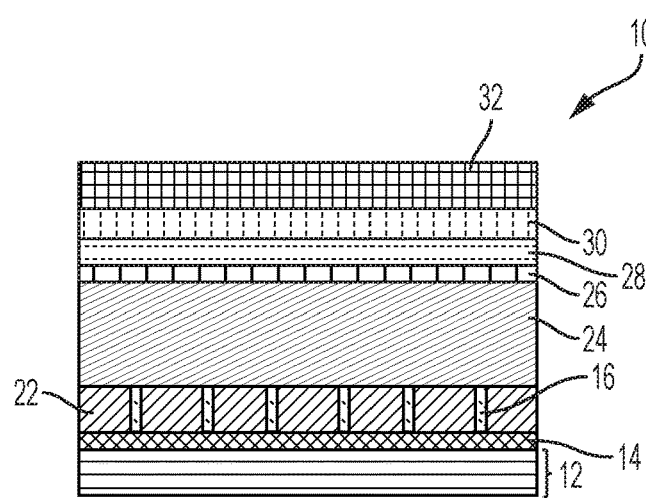
FIG. 14 is a sectional view taken along lines 14-14 of FIG. 13 depicting a semiconductor device after a fabrication operation according to embodiments of the invention.

FIG. 13 depicts a top down view and FIG. 14 depicts a sectional view taken along lines 14-14 of FIG. 13 of the resultant structure subsequent to deposition of multiple layers utilized to fabricate second spacer pattern of lines in a second direction orthogonal to the first spacer pattern of line provided in oxide layer 16 so as to provide an intersection between the spacers. Amorphous silicon layer 24 is deposited onto the planarized surface of the underlying patterned oxide layer 16 (first spacer pattern) embedded in amorphous silicon layer 22. The amorphous silicon layer 24 can be deposited at a thickness of about 1.5 times the height of the first spacer pattern provided in oxide layer 16.

An optional hardmask is formed on the amorphous silicon layer, which can include silicon nitride (Si3N4) layer 26 is deposited onto the amorphous silicon layer 24 and a silicon dioxide (SiO2) layer 28 formed on the amorphous silicon layer 24. By way of example, the silicon nitride layer 26 can have a thickness of 20 nm and the silicon dioxide layer 28 can have a thickness of 40 nm, although greater or lesser thicknesses can be used. An amorphous silicon layer 30 is then deposited onto the oxide layer 28. It should be apparent that the amorphous silicon layer would not be needed if the optional Si3N4/SiO2 hard mask is not used. The mandrel layer 32 is then formed on the amorphous silicon layer 30. Optionally, the mandrel layer 30 can be deposited onto amorphous silicon layer 24, i.e., without the hardmask layers 26, 28.

Figure 15:
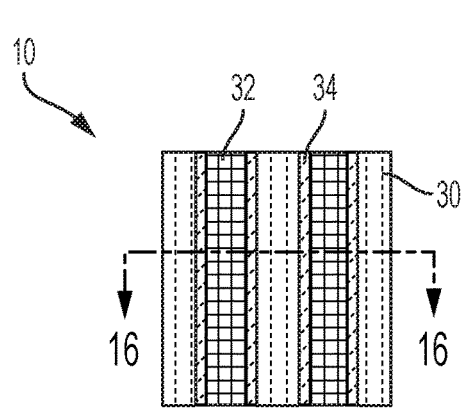
FIG. 15 is a top down view depicting a semiconductor device after a fabrication operation according to embodiments of the invention.
Figure 16:
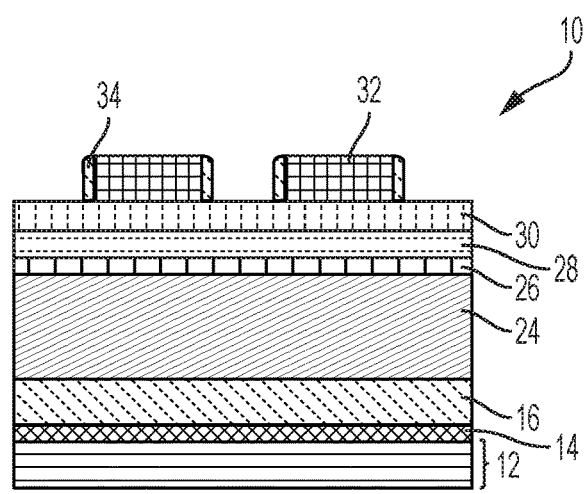
FIG. 16 is a sectional view taken along lines 16-16 of FIG. 51 depicting a semiconductor device after a fabrication operation according to embodiments of the invention.

FIG. 15 depicts a top down view and FIG. 16 depicts a sectional view taken along lines 16-16 of FIG. 15 of the resultant structure subsequent to patterning the mandrel layer 32 and depositing sidewall spacers 34 of an oxide such as silicon dioxide thereon. The width of the oxide spacer 34 is about 15 nm larger than the final dimension to take into account etch bias. This width can be tuned according to the etch bias.

Figure 17:
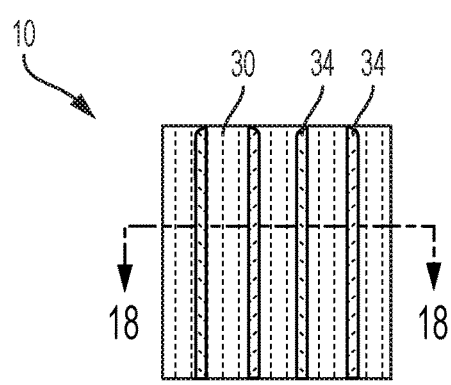
FIG. 17 is a top down view depicting a semiconductor device after a fabrication operation according to embodiments of the invention.
Figure 18:
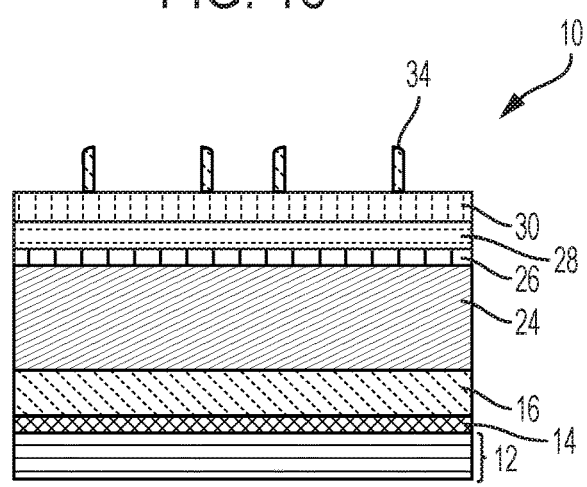
FIG. 18 is a sectional view taken along lines 18-18 of FIG. 17 depicting a semiconductor device after a fabrication operation according to embodiments of the invention.

FIG. 17 depicts a top down view and FIG. 18 depicts a sectional view taken along lines 18-18 of FIG. 17 of the resultant structure subsequent to pulling the patterned mandrel 32 so as to isolate the second spacers 34 on the amorphous silicon layer 30. As noted above, the second spacers 34 are orthogonal to the first spacer pattern.

Figure 19:
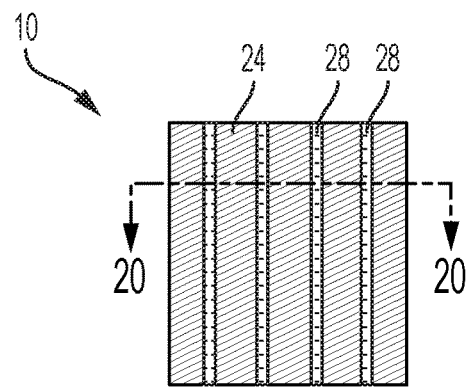
FIG. 19 is a top down view depicting a semiconductor device after a fabrication operation according to embodiments of the invention.
Figure 20:
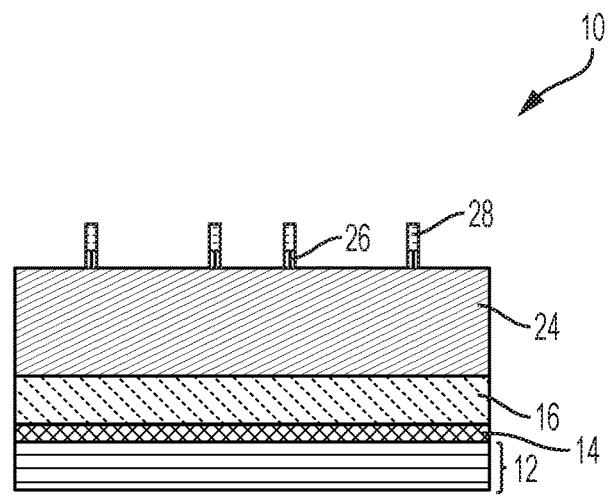
FIG. 20 is a sectional view taken along lines 20-20 of FIG. 19 depicting a semiconductor device after a fabrication operation according to embodiments of the invention.

FIG. 19 depicts a top down view and FIG. 20 depicts a sectional view taken along lines 20-20 of FIG. 19 of the resultant structure subsequent to pattern transfer of the isolated spacers 34 into hardmask layers 26, 28. A portion of the amorphous silicon layer 30 can remain on the patterned oxide layer 28, which will be removed during a later etch step of the amorphous layer 24. The remaining silicon layer 30 on the patterned oxide layer can help maintains the profile shape of the second spacer pattern, which results in improved downstream profiling of the MTJs.

Figure 21:
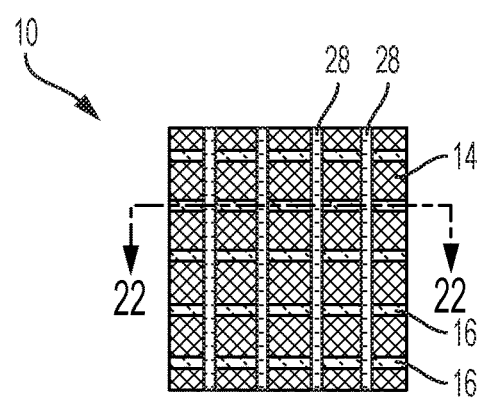
FIG. 21 is a top down view depicting a semiconductor device after a fabrication operation according to embodiments of the invention.
Figure 22:
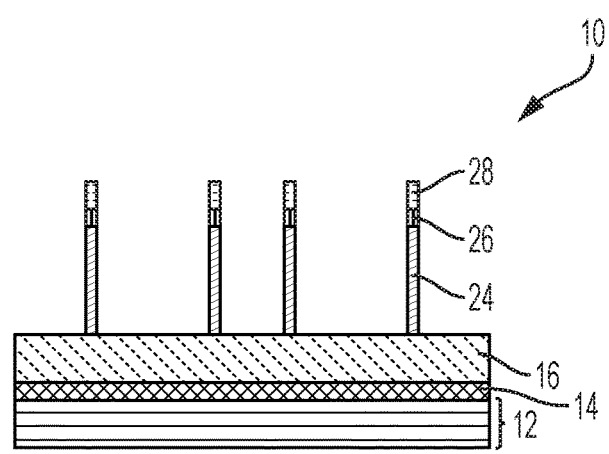
FIG. 22 is a sectional view taken along lines 21-21 of FIG. 21 depicting a semiconductor device after a fabrication operation according to embodiments of the invention.

FIG. 21 depicts a top down view and FIG. 22 depicts a sectional view taken along lines 22-22 of FIG. 21 of the resultant structure subsequent to etch of the amorphous silicon layer 24 to the oxide layer 16 and the hardmask layer 14. As shown, a lattice structure on the hardmask layer 14 is formed, wherein lines defined by the patterned oxide layer 16 are orthogonal to the lines defined by the patterned amorphous silicon layer 24/hardmask layers 26, 28.

Figure 23:
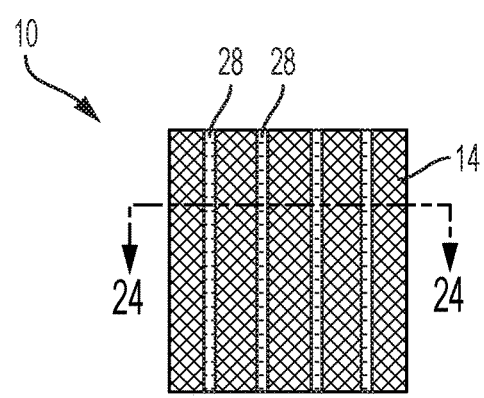
FIG. 23 is a top down view depicting a semiconductor device after a fabrication operation according to embodiments of the invention.
Figure 24:
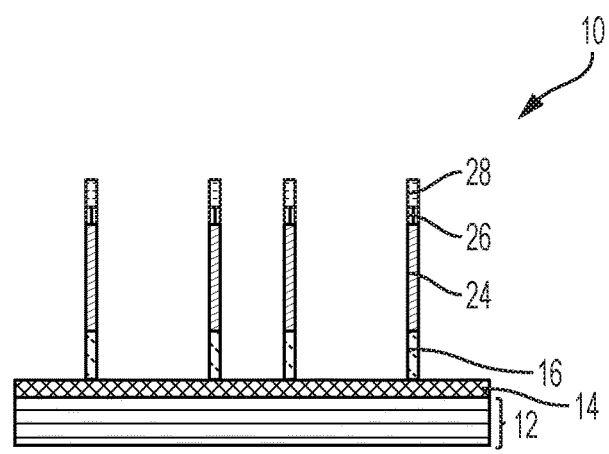
FIG. 24 is a sectional view taken along lines 23-23 of FIG. 23 depicting a semiconductor device after a fabrication operation according to embodiments of the invention.

FIG. 23 depicts a top down view and FIG. 24 depicts a sectional view taken along lines 24-24 of FIG. 23 of the resultant structure subsequent to etching of the exposed lines of the oxide layer 16 so as to isolate the oxide layer 16 under the patterned amorphous silicon layer 24/hardmask layers 26, 28.

Figure 25:
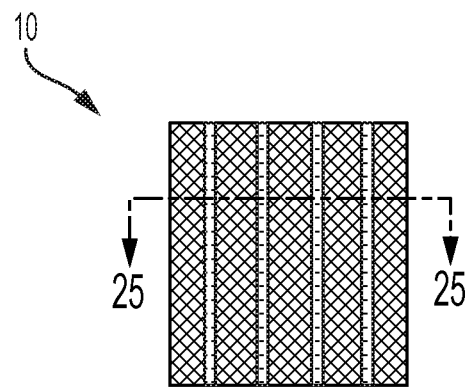
FIG. 25 is a top down view depicting a semiconductor device after a fabrication operation according to embodiments of the invention.
Figure 26:
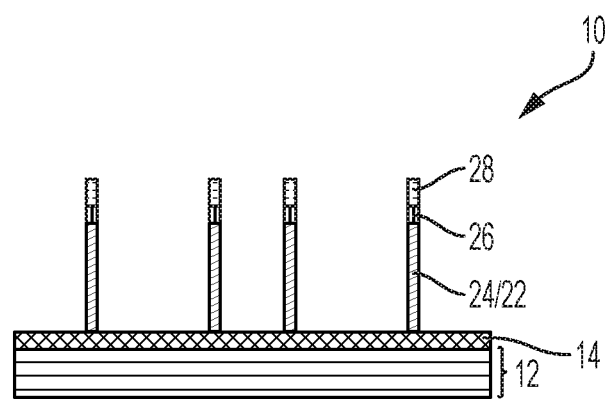
FIG. 26 is a sectional view taken along lines 26-26 of FIG. 25 depicting a semiconductor device after a fabrication operation according to embodiments of the invention.

FIG. 25 depicts a top down view and FIG. 26 depicts a sectional view taken along lines 26-26 of FIG. 25 of the resultant structure, which depicts the patterned amorphous silicon layer 24/hardmask layers 26, 28 adjacent to the remaining oxide layer 16. The amorphous silicon layers 22, 24 are depicted.

Figure 27:
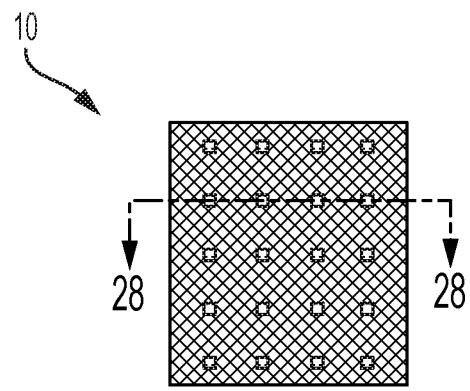
FIG. 27 is a top down view depicting a semiconductor device after a fabrication operation according to embodiments of the invention.
Figure 28:
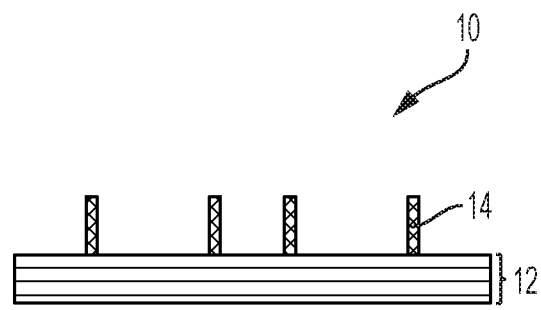
FIG. 28 is a sectional view taken along lines 28-28 of FIG. 27 depicting a semiconductor device after a fabrication operation according to embodiments of the invention.

FIG. 27 depicts a top down view and FIG. 28 depicts a sectional view taken along lines 28-28 of FIG. 27 of the resultant structure subsequent to etching of the amorphous silicon layers followed by etching into the hardmask layer 14 of remaining pattern, which results in patterned pillars overlaying the multiple layers defining the MTJ stack. The MTJ stack is then etched to define an MTJ array, wherein the dimensions of the MTJs can be sub-lithographic and defined by the intersection of the spacers patterns as described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    providing a substrate comprising multiple layers thereon for defining a magnetic tunnel junction material stack, the multiple layers comprising a reference ferromagnetic layer having a fixed magnetic polarity, a tunnel barrier layer, and a free ferromagnetic layer on an opposite side of the tunnel barrier layer;
    depositing a hardmask layer onto the magnetic tunnel junction material stack;
    forming a first spacer line pattern on the hardmask layer in a first direction, wherein the first spacer line pattern is formed of an oxide;
    forming a second spacer line pattern in a second direction over the first spacer line pattern to form a sub-lithographic region at an intersection between the first spacer line pattern and the second spacer line pattern, wherein the first direction is orthogonal to the second direction; and
    etching the hardmask layer to define a magnetic tunneling junction at the intersection and within the magnetic tunnel junction material stack, wherein etching the hardmask comprises etching to remove non-intersecting portions of the first spacer line pattern from the substrate; etching the second spacer line pattern from the substrate to isolate the intersecting portion of the first spacer line pattern, wherein the intersecting portion of the first spacer line pattern defines a sub-lithographic feature; etching the hardmask layer to the magnetic junction material stack to transfer the intersecting portion into the hardmask layer; and etching the magnetic junction material stack to form the magnetic tunnel junction having dimensions corresponding to the sub-lithographic feature.

2. The method of claim 1, wherein forming the first spacer line pattern comprises lithographically patterning a first mandrel layer to form a first mandrel pattern having substantially vertical sidewalls; forming a first sidewall spacer on the substantially vertical sidewalls, wherein the first sidewall spacers have a sub-lithographic width; removing the first mandrel pattern to isolate the first sidewall spacers; and transferring the isolated first sidewall spacers into an oxide layer, wherein the isolated first sidewall spacers define the first spacer line pattern.

3. The method of claim 1, wherein forming the second spacer line pattern comprises lithographically patterning a second mandrel layer to form a second mandrel pattern having substantially vertical sidewalls; forming a second sidewall spacer on the substantially vertical sidewalls; removing the second mandrel pattern to isolate the second sidewall spacers; transferring the isolated second sidewall spacers to the hardmask layer to isolate the intersecting portion of the first spacer line pattern having the sub-lithographic feature.

4. The method of claim 1, wherein forming the first spacer line pattern comprises lithographically patterning a first mandrel layer to form a first mandrel pattern having substantially vertical sidewalls; forming a first sidewall spacer on the substantially vertical sidewalls, wherein the first sidewall spacers have a sub-lithographic width; removing the first mandrel pattern to isolate the first sidewall spacers; and transferring the isolated first sidewall spacers into an oxide layer, wherein the isolated first sidewall spacers define the first spacer line pattern in the oxide layer; and
    wherein forming the second spacer line pattern comprises lithographically patterning a second mandrel layer to form a second mandrel pattern having substantially vertical sidewalls; forming a second sidewall spacer on the substantially vertical sidewalls; removing the second mandrel pattern to isolate the second sidewall spacers;
    transferring the isolated second sidewall spacers to the hardmask layer to isolate the intersecting portion of the first spacer line pattern having the sub-lithographic feature.

5. The method of claim 1, wherein the hardmask layer comprises tantalum nitride.

6. The method of claim 4, wherein the first sidewall spacers are formed of silicon nitride and are at a height at least 1.5 times the oxide layer.

7. The method of claim 4, wherein the first sidewall spacers are formed of silicon nitride and the mandrel layer is formed of amorphous silicon, and wherein the second sidewall spacers are formed of amorphous silicon and the mandrel layer is formed of silicon nitride.

8. The method of claim 4, wherein transferring the isolated first sidewall spacers into the oxide layer further comprises depositing an amorphous silicon layer over the first sidewall spacers and the oxide layer; and removing a portion of the amorphous silicon layer and the isolated first sidewall spacers to the first spacer line pattern.

9. The method of claim 4, wherein the oxide layer is silicon dioxide.

* * * * *

UNITED STATES PATENT AND TRADEMARK OFFICE
CERTIFICATE OF CORRECTION

| | | |
|---|---|---|
| PATENT NO. | : 10,566,524 B2 | Page 1 of 1 |
| APPLICATION NO. | : 15/814797 | |
| DATED | : February 18, 2020 | |
| INVENTOR(S) | : Annunziata et al. | |

It is certified that error appears in the above-identified patent and that said Letters Patent is hereby corrected as shown below:

On the Title Page

Column 1, (72) Inventors: should read as follows:
Anthony J. Annunziata, Stamford, CT (US);
Babar A. Khan, New York, NY, (US);
Chandrasekaran Kothandaraman, New York, NY (US);
John R. Sporre, Albany, NY (US)

Signed and Sealed this
Twelfth Day of May, 2020

Andrei Iancu
*Director of the United States Patent and Trademark Office*